(12) United States Patent
Spijker

(10) Patent No.: US 10,476,509 B2
(45) Date of Patent: Nov. 12, 2019

(54) TIME SLOTTED BUS SYSTEM FOR MULTIPLE COUPLED DIGITAL PHASE-LOCKED LOOPS

(71) Applicant: Integrated Device Technology, Inc., San Jose, CA (US)

(72) Inventor: Menno Spijker, Ottawa (CA)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 94 days.

(21) Appl. No.: 15/831,760

(22) Filed: Dec. 5, 2017

(65) Prior Publication Data

US 2018/0159541 A1 Jun. 7, 2018

Related U.S. Application Data

(60) Provisional application No. 62/431,138, filed on Dec. 7, 2016.

(51) Int. Cl.
| | |
|---|---|
| H03L 7/07 | (2006.01) |
| H04L 7/033 | (2006.01) |
| H04J 3/06 | (2006.01) |
| H03L 7/08 | (2006.01) |
| H03L 7/093 | (2006.01) |
| H03L 7/099 | (2006.01) |

(52) U.S. Cl.
CPC .............. *H03L 7/07* (2013.01); *H03L 7/0805* (2013.01); *H03L 7/093* (2013.01); *H03L 7/0991* (2013.01); *H04J 3/0641* (2013.01); *H04J 3/0697* (2013.01); *H04L 7/0331* (2013.01); *H03L 2207/06* (2013.01); *H04J 3/0667* (2013.01)

(58) Field of Classification Search
CPC ..... H03L 7/07; H03L 7/0805; H03L 2207/50; H03L 2207/06; H03L 7/08; H03L 7/0991; H04J 3/0697; H04L 7/0331
See application file for complete search history.

(56) References Cited

U.S. PATENT DOCUMENTS

| | | | |
|---|---|---|---|
| 6,285,172 B1 * | 9/2001 | Torbey | G06F 1/10 323/237 |
| 9,369,270 B1 | 6/2016 | Spijker | |
| 10,075,284 B1 * | 9/2018 | Rodrigues | H04L 7/033 |
| 2002/0070811 A1 * | 6/2002 | Skierszkan | H03L 7/07 331/1 A |
| 2007/0255919 A1 | 11/2007 | Ware et al. | 711/167 |
| 2010/0111113 A1 * | 5/2010 | Wong | H04J 3/0664 370/503 |
| 2010/0158037 A1 * | 6/2010 | Heinke | H04L 12/403 370/445 |
| 2013/0100967 A1 * | 4/2013 | Secker | H04J 3/0691 370/503 |
| 2013/0300470 A1 * | 11/2013 | Mohajeri | H03L 7/1075 327/157 |

(Continued)

*Primary Examiner* — Khanh C Tran
(74) *Attorney, Agent, or Firm* — Christopher P. Maiorana, PC

(57) ABSTRACT

An apparatus includes a plurality of digital phase-locked loops and a time slotted bus. The time slotted bus is configured to couple the plurality of digital phase-locked loops. The plurality of digital phase-locked loops may be configured to exchange parameters between two or more of the plurality of digital phase-locked loops using one or more time slots of the time slotted bus.

20 Claims, 9 Drawing Sheets

(56) References Cited

U.S. PATENT DOCUMENTS

| | | | |
|---|---|---|---|
| 2014/0086261 A1 | 3/2014 | Rao et al. ................... | 370/419 |
| 2014/0254735 A1* | 9/2014 | Nemawarkar ........ | H04L 7/0331 |
| | | | 375/376 |
| 2015/0012757 A1 | 1/2015 | Binder .......................... | 713/190 |

* cited by examiner

TIME SLOTTED BUS SYSTEM FOR MULTIPLE COUPLED DIGITAL PHASE-LOCKED LOOPS

This application relates to U.S. Provisional Application No. 62/431,138, filed Dec. 7, 2016, which is hereby incorporated by reference in its entirety.

FIELD OF THE INVENTION

The invention relates to integrated circuits generally and, more particularly, to a method and/or apparatus for implementing a time slotted bus system for multiple coupled digital phase-locked loops (DPLLs).

BACKGROUND

In a system with multiple coupled digital phase-locked loops (DPLLs), one or more receiving DPLLs can adjust a respective frequency offset from a loop filter within the receiving DPLLs using one or more frequency offsets received from multiple sourcing DPLLs. For example, one sourcing DPLL could be locked to a system Oven Controlled Crystal Oscillator (OCXO) or Temperature Controlled Crystal Oscillator (TCXO) while another sourcing DPLL could be locked to a network clock. The receiving DPLL could be locked to a packet stream. The coupling from the two sourcing DPLLs would enhance the stability of the receiving DPLL. When more than two DPLLs are coupled, the complexity of the wiring connections between the DPLLs grows rapidly.

It would be desirable to implement a time slotted bus system for multiple coupled DPLLs.

SUMMARY

The invention concerns an apparatus including a plurality of digital phase-locked loops (DPLLs) and a time slotted bus. The time slotted bus may be configured to couple the plurality of digital phase-locked loops. The plurality of digital phase-locked loops may be configured to exchange parameters between two or more of the plurality of digital phase-locked loops using one or more time slots of the time slotted bus.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the invention include providing a time slotted bus system for multiple coupled digital phase-locked loops (DPLLs) that may (i) allow multiple DPLLs to be coupled to one another rather than just one to one, (ii) time division multiplex values on a bus coupled between multiple DPLLs, (iii) allocate two or more fixed time slots to each DPLL, (iv) allow users to program time slots in which data may be fetched or broadcast by each DPLL, (v) allow modification of loop filter output based on data fetched from the one or more time slots, (vi) implement separate data and address busses, (vii) implement bus handler modules coupling each DPLL to the time slotted bus, (viii) minimize wiring connections coupling multiple DPLLs, and/or (ix) be implemented as one or more integrated circuits.

Figure 1:
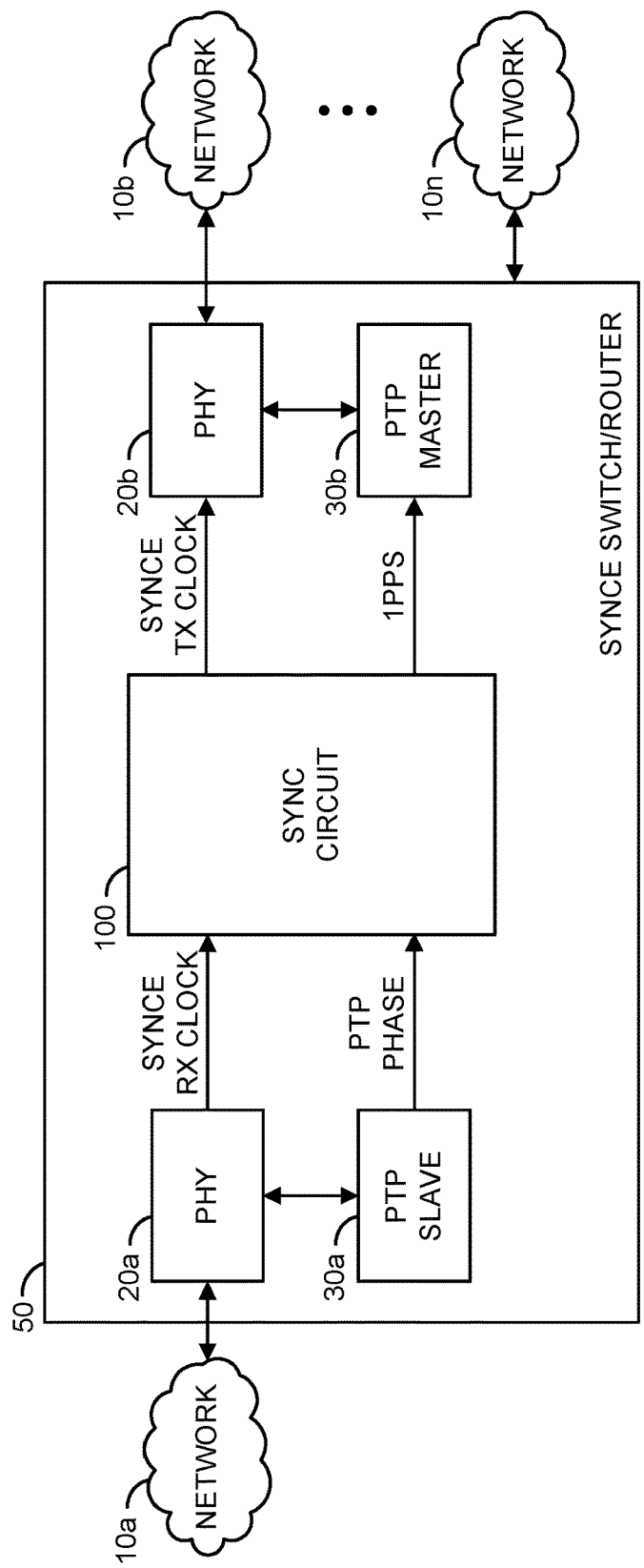
FIG. 1 is a diagram illustrating an example embodiment of the invention in a telecommunications network context.

Referring to FIG. 1, a diagram is shown illustrating a telecommunications network context in which an example embodiment of the present invention may be implemented. In an example, a telecommunications network may comprise a number of network segments 10a-10n. In an example, the network segments 10a-10n may be coupled using a number of blocks (or circuits) 20a-20n, a number of blocks (or circuits) 30a-30n, and a block (or circuit) 100. In an example, the network segment 10a may be coupled to a block 20a and the network segment 10b may be coupled to a block 20b. The block 20a may be coupled to a block 30a and the block 100. The block 20b may be coupled to a block 30b and the block 100.

In an example, the blocks 20a-20n, the blocks 30a-30b, and the block 100 may be implemented as part of a block (or circuit or module) 50. In an example, the block 50 may implement a Synchronous Ethernet (e.g., SyncE) switch or router box coupling the multiple network segments 10a-10n of the telecommunications network. Such SyncE switches and routers are typically deployed throughout a telecommunications network (e.g., in man-sized cabinets beside roadways in neighborhoods, in a server rack, etc.). In an example, the circuit 50 may be implemented as a single integrated circuit or as a number of integrated circuits on a printed circuit board (e.g., a network card, server blade, etc.). In an example, the block 50 may be implemented as a network card and/or a network circuit board.

The network segments 10a-10n may implement a number of local area networks (LANs) whose operations are to be synchronized with one another. In various embodiments, the network segments 10a-10n may comprise networks based on time division multiplexing (TDM), such as SONET/SDH/PDH, and/or Ethernet-based packet networks. The network segments 10a-10n may be configured to facilitate delivery of a variety of communication services. The blocks 20a-20n may be implemented as physical layer (PHY) transceivers. In an example, the blocks 20a-20n may be implemented using Ethernet PHY transceiver chips (e.g., available from Marvell or Broadcom). The blocks 30a-30n may be implemented as precision time protocol (PTP)

modules. In an example, the blocks 30a-30b may implement a IEEE 1588 compliant packet based timing scheme. In an example, the block 30a may be implemented as a PTP slave module and the block 30b may be implemented as a PTP master module. A PTP slave clock generally receives sync messages from a PTP master clock. The time base is determined for the PTP slave clock by a PTP master clock higher in hierarchy. The PTP master clock generally initiates sync messages to PTP slave clocks and determines the time base for PTP slave clocks lower in hierarchy.

Many existing telecommunication networks are based on TDM. TDM networks need precise frequency synchronization for accurate data transfer. TDM networks work well for voice and low bandwidth data. However, some modern communication services need both time and frequency synchronization. There are many timing applications that can make use of highly accurate synchronized distributed clocks (e.g., data acquisition, digital video distribution, financial trading, the Internet of Things (IoT), small cell coordination, manufacturing automation and robotics, power systems, and mobile telephone cell coordination). Wireless backhaul is an example application driving the need, where mobile subscribers must be handed off from one service area or cell to another. Typical computer networks closer to the end user are Ethernet-based packet networks. These are low cost asynchronous networks that transfer data with much less frequency accuracy than the TDM networks.

Approaches used to "synchronize" packet networks to TDM networks generally include: Primary Reference Source (PRS), Synchronous Ethernet (SyncE), and Precision Time Protocol (PTP). The PRS approach utilizes a primary reference clock (PRC) yielding Stratum 1 quality frequency and timing, such as a GPS-derived clock, at every node communicating to a TDM network. The PRS approach provides a high quality but relatively costly approach. Synchronous Ethernet (SyncE) is an International Telecommunication Union ITU-T standard for computer networking that facilitates the transfer of clock signals over the Ethernet physical layer. SyncE differs from "regular" Ethernet with respect to the carrier clock. In SyncE, the carrier clock is synchronized and traceable to a primary reference clock (PRC), whereas with regular Ethernet the carrier clock is a locally generated free running clock. In both cases, the carrier clock is extracted from data received by the physical layer (PHY). In the SyncE approach, free-running crystal oscillators at each Ethernet node, whose frequencies are within ±100 ppm of each other, are replaced by clock recovery phase-locked loops (PLLs) with free-run accuracy of ±4.6 ppm. For a PLL device that needs to lock to a physical SyncE clock, the process is essentially the same as locking to any other telecom-type clock with the frequency being a function of application.

The packet based timing approach inserts dedicated timing stamp packets into a data stream of the packet network. IEEE 1588 is a standard that defines the distribution of timing over packet based networks. As will be understood by those skilled in the art, the timing is no longer carried by a physical clock. Instead, time stamps are sent back and forth between a server (e.g., master) and a client (e.g., slave). The time stamps from the server are linked to the PRC (Cesium, Rubidium, GPS, etc.), whereas the time stamps of the client are linked to the clock recovered by the client (e.g., from packet data). In particular, the client extracts the timing from a collection of received and locally generated time stamps. A digitally-controlled oscillator (DCO) at the client generates the physical clock and a 1 pulse per second (1 PPS) timing pulse. Ideally, the 1 PPS timing pulse generated by the client is phase aligned with the 1 PPS signal generated by the server. The client needs to control both the frequency of the output clock(s) and frame/timing pulses as well as the phase of the 1 PPS timing pulse. The latter is preferably independent of the output clock frequency notwithstanding the fact that the frequency and phase are hard related to each other. The independence is due to the fact that the phase/position of the 1 PPS timing pulse during the initial snap alignment may be adjusted without changing the frequency and phase of the output clocks.

Using a combination of both SyncE and IEEE 1588 for synchronization typically provides the stability and precision of a physical SyncE clock with the ability to synchronize frame/timing pulses in accordance with IEEE 1588. The SyncE clock and the IEEE 1588 time stamps may or may not be traceable to the same primary reference clock. But, if the SyncE clock and the IEEE 1588 time stamps are traceable to the same primary reference clock, then the SyncE clock can be used for: (i) frequency synchronization of the output clock and the frame/timing pulse; and (ii) phase alignment of the output clock to the input SyncE clock. This can be achieved by the standard function of the PLL, which is the same as in a regular telecom clock (E1, T1, Sonet, etc.) application. In addition, the IEEE 1588 time stamps may be used to calculate the phase offset between the 1 PPS timing pulse of the server and the 1 PPS timing pulse of the client and then align the two pulses by moving the 1 PPS timing pulse of the client (in phase). The client typically should be able to move the 1 PPS timing pulse by ±0.5 sec.

PTP based on the IEEE 1588 standard has been widely adopted as the method for implementing packet based timing. The IEEE 1588 based PTP is a lower cost solution that can support both frequency and phase synchronization traceable to a primary reference source. Synchronization is implemented by messages exchanged between a master clock and a slave clock on the network. Both SyncE and packet based (IEEE 1588) synchronization approaches are recognized and specified by the ITU-T G.8261 standard. The SyncE approach only supplies accurate frequency. The SyncE approach does not supply accurate phase information, since the path delays between network elements are generally unknown. Using a combination of both SyncE and IEEE 1588 for synchronization typically provides the stability and precision of a physical SyncE clock with the ability to synchronize frame/timing pulses in accordance with IEEE 1588.

In an example, the block 100 may comprise a synchronization circuit implemented in accordance with an example embodiment of the invention. In an example, the synchronization circuit 100 may be configured to synchronize the multiple network segments 10a-10n coupled to the SyncE switch or router 50. In an example, embodiments of the invention may be implemented to synchronize multiple networks (e.g., two or more). The number of networks may be varied according to the design criteria of a particular implementation. In general, the telecommunications network may comprise other components (not shown). The number, type and/or arrangement of the components implementing the block 50 may be varied according to the design criteria of a particular implementation.

In the example shown, the network 10a may be a transmitting (e.g., sending) network and the network 10b may be a receiving network. The PHY transceivers 20a-20b may be configured to send/receive data to/from the networks 10a-10b, the PTP modules 30a-30b and/or the synchronization circuit 100. In the example shown, the PHY transceivers 20a and 20b may generate or receive a signal (e.g., SYNCE RX CLOCK or SYNCE TX CLOCK, respectively). The signal SYNCE RX CLOCK from the block 20a to the block 100 may communicate a physical SyncE clock recovered from the network segment 10a. The signal SYNCE TX CLOCK from the block 100 to the block 20b may communicate a SyncE transmit clock for broadcast to one or more of the network segments 10b-10n.

The PTP modules 30a-30b may be configured to provide precise time over an internet computing network. For example, the PTP modules 30a-30b may be interconnected by switches (e.g., dedicated, high-speed LAN segments interconnected by switches) and synchronize device clocks over the computing network. In the example, shown, the PTP module 30a may implement a PTP slave module. The PTP slave module 30a may present a signal (e.g., PTP PHASE). The signal PTP PHASE may be presented to an input of the block 100. In the example shown, the PTP module 30b may implement a PTP master module. The PTP master module 30b may receive a signal (e.g., 1 PPS). The signal 1 PPS may be generated by the block 50. The signal 1 PPS generally implements a 1 pulse per second (1 PPS) timing signal. In general, the signals SYNCE RX CLOCK and SYNCE TX CLOCK, the signal PTP PHASE, and/or the signal 1 PPS may be used to synchronize the networks 10a-10n.

The module 50 may be configured to synchronize a timing of communication signals transmitted and/or received using one or more communication protocols. In some embodiments, the module 50 may implement a SyncE router and/or switch. In an example, the module 50 may be used to implement a synchronous Ethernet Wide Area Network (WAN). In some embodiments, the module 50 may be implemented to facilitate synchronous communication in a digital subscriber line access multiplexor (DSLAM).

In the example shown, the module 50 may comprise a block (or circuit or apparatus) 100. The apparatus 100 may implement a synchronization circuit. The synchronization circuit 100 may be configured to perform time and frequency synchronization of a plurality of clock signals in response to phase and/or time changes on selected input clocks. Details of the synchronization circuit 100 are described below.

The blocks 20a-20b, the blocks 30a-30b, and the block 100 generally illustrate a conceptual timing portion of the SyncE switch or router 50. Data paths including the PHYs 20a-20n with the actual switching and/or routing data circuits in between are not shown. Typically, an Ethernet switch or router gets more than two network nodes. One of the network nodes (e.g., network segment 10a) is generally chosen as the timing source and the rest of the network nodes (e.g., network segments 10b-10n) are synchronized to the source. Thus, only network segments 10a and 10b are shown to illustrate the timing concept. Although the other network segments are not shown for clarity, it would be apparent to those skilled in the field of the invention that the PTP master 30b may be configured to drive multiple channels of a respective PHY to multiple network nodes.

Figure 2:
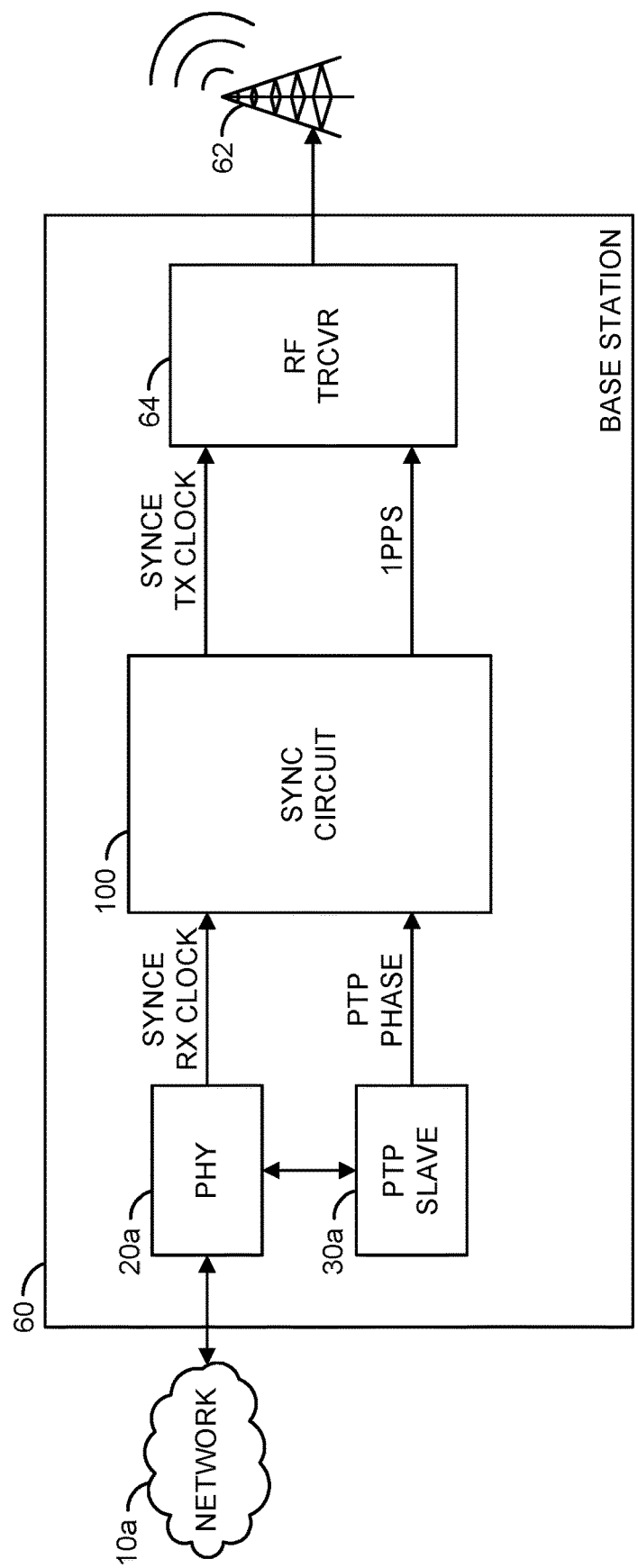
FIG. 2 is a diagram illustrating an example embodiment of the invention in a mobile communications network context.

Referring to FIG. 2, a diagram is shown illustrating a mobile communication network context in which an example embodiment of the invention may be implemented. In the mobile communication network context, the PHY transceiver 20a, the PTP slave module 30a, and the synchronization block (or circuit) 100 may be implemented as part of a base station 60 coupled to the network 10a. The base station 60 may implement a mobile communication base station (e.g., LTE eNodeB, small cell base station, etc.). The base station 60 may be coupled to a communication device (e.g., a transceiver and antenna array) 62 by a radio frequency (RF) transceiver 64. The RF transceiver 64 may be configured to receive the signals SYNCE TX CLOCK and 1 PPS from the circuit 100. In an example, the network 10a may be configured to provide node clocks for cellular and/or wireless local loop (WLL) base-stations (e.g., for GSM, 3G, 4G and/or 5G communication) using the PHY transceiver 20a, the PTP slave module 30a, and the synchronization block (or circuit) 100. The synchronous communication applications and/or protocols implemented by the network 10a and the base station 60 may be varied according to the design criteria of a particular implementation.

Figure 3:
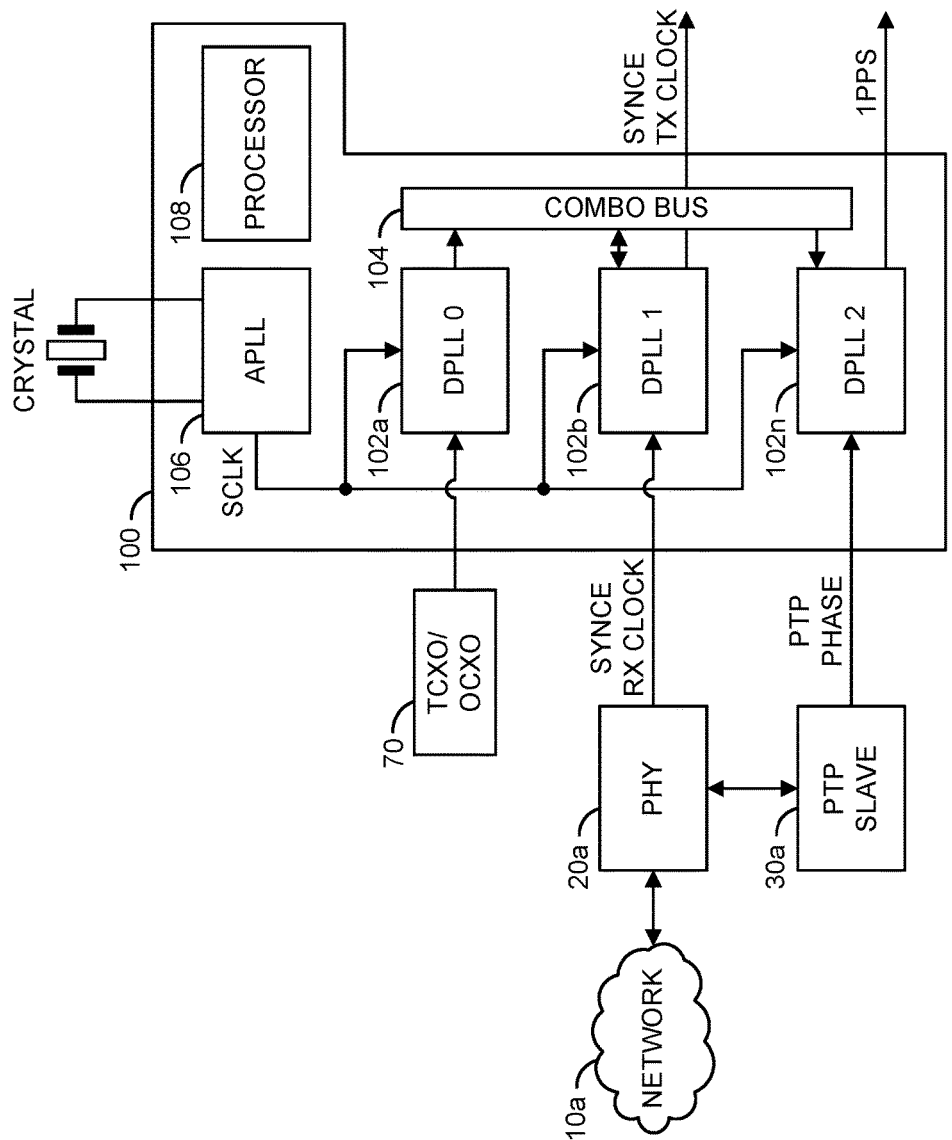
FIG. 3 is a diagram illustrating an example implementation in accordance with an example embodiment of the invention.

Referring to FIG. 3, a diagram of the circuit 100 is shown illustrating an example implementation of a synchronization circuit in accordance with an example embodiment of the invention. In an example, the circuit 100 is illustrated in the context of a timing application of a telecom boundary clock as described in Recommendation ITU-T G.8273.2 Appendix III, which is incorporated by reference. In an example embodiment. In an example, the circuit 100 may have a first input that receives a first timing signal (e.g., SYNCE RX CLOCK), a second input that receives a second timing signal (e.g., PTP PHASE), a third input that is connected to a temperature compensated oscillator/oven compensated oscillator (TCXO/OCXO) circuit 70, a first output that presents a first output timing signal (e.g., SYNCE TX CLOCK), and a second output that presents a second timing signal (e.g., 1 PPS). The signals SYNCE RX CLOCK, PTP PHASE, SYNCE TX CLOCK, and 1 PPS may be implemented as described above (in connection with FIG. 1). The TCXO/OCXO circuit 70 may provide a precision frequency source with a high level of temperature stability.

The circuit 100 may comprise a number of blocks (or circuits) 102a-102n, a block (or circuit) 104, a block (or circuit) 106, and a block (or circuit) 108. The blocks 102a-102n may implement digital phase-locked loops (DPLLs). The block 104 may implement a time slotted bus in accordance with an embodiment of the invention. The block 106 may implement an analog phase-locked loop (APLL). The block 108 may implement a processor (e.g., embedded processor, microprocessor, microcontroller, etc.). In various embodiments, the circuit 100 may be implemented as a single integrated circuit or as a number of integrated circuits on a printed circuit board (e.g., a network card, server blade, etc.). In some embodiments, the circuit 100 may comprise additional components (not shown). The number, type, and/or arrangement of the additional components of the circuit 100 may be varied according to the design criteria of a particular implementation.

In an example, the DPLLs 102b and 102n may be configured to generate the output timing signals SYNCE TX CLOCK and 1 PPS. The output timing signals SYNCE TX CLOCK and 1 PPS generally will have a phase related to the input timing signals (e.g., SYNCE RX CLOCK and/or PTP PHASE). One or more of the DPLLs 102a-102n may be configured as a sourcing DPLL. In the example shown, the DPLLs 102a and 102b may be the sourcing DPLLs. One or more of the DPLLs 102a-102n may be configured as a receiving DPLL. In the example shown, the DPLL 102n may be the receiving DPLL. The receiving DPLLs are generally configured to utilize one or more timing parameters broadcast by the sourcing DPLLs via the combo bus 104 to adjust a respective digitally controlled oscillator (DCO). The circuit 100 may be configured to select which of the sourcing DPLLs (e.g., DPLLs 102a and 102b) sources the receiving DPLLs (e.g., DPLL 102n). In an example, the sourcing DPLLs 102a-102b may provide a redundant source for the receiving DPLL 102n.

In various embodiments, the APLL 106 implements a local crystal oscillator based system clock (e.g., SCLK). Crystal oscillators typically provide very good short term stability (e.g., low jitter) but are quite sensitive to temperature variations (e.g., wander). The local crystal oscillator based system clock SCLK may be common to all of the DPLLs 102a-102n, and may be seen as a noise source within the DPLL loop.

The processor 108 may be configured to process input and/or internal signals of the circuit 100. The processor 108 may generate and/or receive signals to/from the various components of the circuit 100 (not shown). In some embodiments, the processor 108 may be configured to monitor a status and/or activity of the DPLLs 102a-102n. The processor 108 may implement a monitoring module configured to provide knowledge of a re-arrangement (e.g., when a sourcing DPLL makes a reference switch). For example, using the processor 108 may enable the circuit 100 to know beforehand that a re-arrangement is upcoming. The processor 108 may provide a-priori information about re-arrangement to inter DPLL coupling and/or reference switches. In some embodiments, the processor 108 may be implemented as an embedded processor (e.g., an ARM processor). In some embodiments, the processor 108 may implement a state machine. The implementation of the processor 108 may be varied according to the design criteria of a particular implementation.

In various embodiments, the circuit 100 may comprise multiple sourcing digital phase-locked loops (DPLLs) and one or more receiving digital phase-locked loops (DPLLs). The multiple sourcing DPLLs may be coupled to the one or more receiving DPLLs. The coupling generally allows communication of timing parameters from the multiple sourcing DPLLs to the receiving DPLL(s). The communicated timing parameters may enhance the stability of the receiving DPLL(s). In various embodiments, the multiple DPLLs may be coupled together using a novel time slotted bus (described below and referred to as a combo bus). In various embodiments, the circuit 100 may comprise an integer number (e.g., N) of digital phased-locked loop circuits (DPLLs) 102a-102n. In an example, the device 100 may implement 9 DPLLs (e.g., N=9).

A crystal oscillator together with the APLL 106 provide the system clock SCLK to all the DPLLs. The DPLL 102a (DPLL0) locks to the temperature compensated oscillator (TCXO) 70 which provides a much better stability over temperature than the crystal oscillator. DPLL0 outputs the compensation for the crystal drift compared to the TCXO/OCXO 70 to the DPLL 102b (DPLL1) and the DPLL 102n (DPLL2). The compensation from DPLL0 provides a much better unassisted holdover stability to the system. The crystal gives the output clocks of the system a better overall phase noise performance.

The network 10a provides a SyncE/PTP network packet stream. In the PHY 20a and the PTP Slave 30a, the physical SyncE clock (e.g., SYNCE RX CLOCK) and the embedded PTP timing (e.g., PTP PHASE) are extracted. DPLL1 locks to the physical SyncE clock SYNCE RX CLOCK and suppresses its jitter and wander while DPLL2 generates a 1 Pulse Per Second (1 PPS) signal from the PTP timing PTP PHASE. DPLL1 provides the frequency offset of the physical SyncE clock SYNCE RX CLOCK to DPLL2 and thereby stabilizes the signal 1 PPS generated by DPLL2.

In an example, the DPLL 102a may be locked to the timing signal from the temperature compensated oscillator (or oven controlled oscillator (TCXO/OCXO) 70, while the sourcing DPLL 102b may be locked to the SyncE receive clock SYNCE RX CLOCK. The receiving DPLL 102n may be locked to a timing information contained in a packet stream (e.g., PTP PHASE). The DPLL 102a may suppress short term variations on the local crystal oscillator based system clock SCLK. The sourcing DPLL 102a should have a high enough bandwidth to track the temperature variations (wander) of the local crystal oscillator based system clock SCLK sufficiently. At the same time, the DPLL 102a should have a bandwidth low enough to not let the jitter from the TXCO/OCXO 70 pass through. In an example, the sourcing DPLL 102b may be locked to the SyncE timing signal. The receiving DPLL 102n may now be stabilized by both the DPLLs 102a and 102b with respect to long and very long term stability, while still having the excellent low output jitter levels due to the local crystal oscillator based system clock SCLK.

Figure 4:
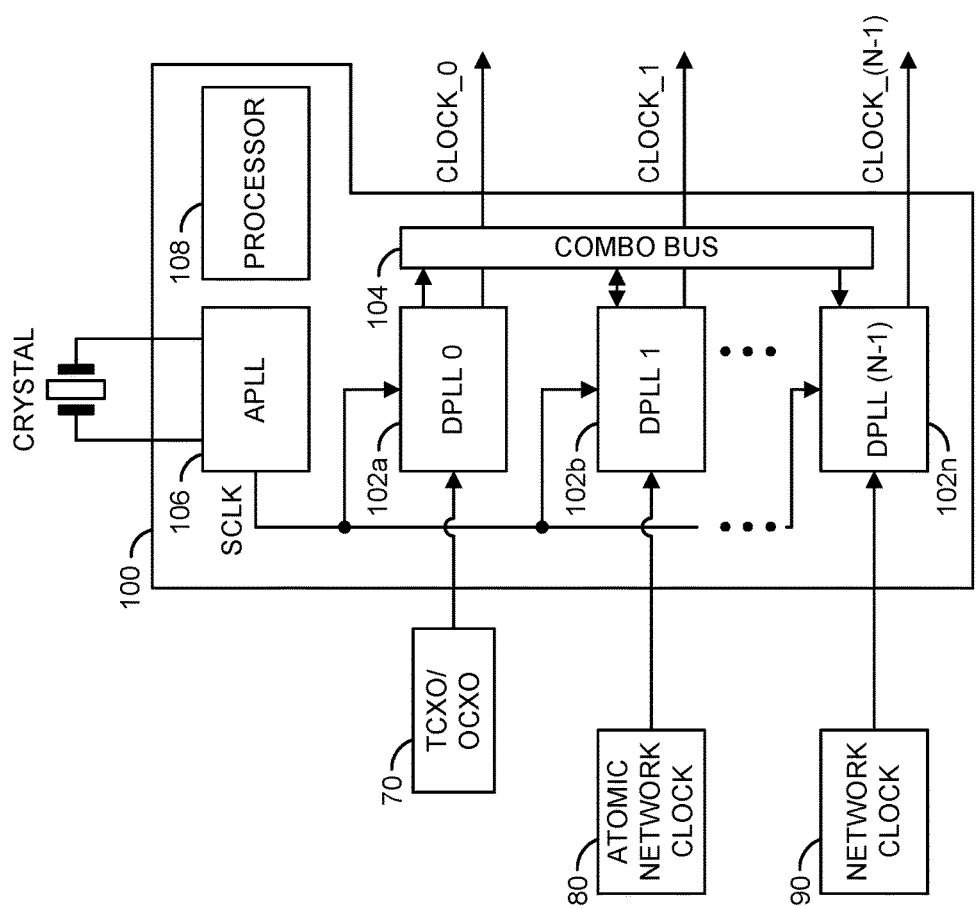
FIG. 4 is a diagram illustrating another example implementation in accordance with an example embodiment of the invention.

Referring to FIG. 4, a diagram of the circuit 100 is shown illustrating another example implementation of the synchronization circuit 100 in accordance with an example embodiment of the invention. In some embodiments, the synchronization circuit 100 may be configured to utilize a number of network clocks. In an example, the circuit 100 may have a first input that receives a first timing signal from an atomic network clock 80, a second input that receives a second timing signal from a network clock 90, a third input that is connected to a temperature compensated oscillator/oven controlled oscillator (TCXO/OCXO) circuit 70, a first output that presents a first output timing signal (e.g., CLOCK_0), a second output that presents a second timing signal (e.g., CLOCK_1), and a third output that presents a third timing signal (e.g., CLOCK_(N−1)). The circuit 100 may be configured to lock to the network clock 90 using the TCXO/OCXO 70 and atomic network clock 80 for increased stability.

In an example, the block 102a and a block 102b may be configured as sourcing DPLLs and the block 102n may be configured as a receiving DPLL. The block 102a may be locked to the timing signal from the temperature compensated oscillator/oven controlled oscillator (TCXO/OCXO) 70, while the sourcing DPLL 102b may be locked to a network clock (e.g., the atomic network clock 80). The receiving DPLL 102n may be locked to a packet stream (e.g., the network clock 90). The DPLL 102a may suppress short term variations on the TXCO/OCXO 70 connected to the device 100. The sourcing DPLL 102a should have a high enough bandwidth to track the temperature variations (wander) of the local crystal oscillator based system clock 106 sufficiently. At the same time, the DPLL 102a should have a bandwidth low enough to not let the jitter from the TXCO/OCXO 70 pass through. In an example, the sourcing DPLL 102b may be locked to a network clock with excellent long term stability, such as the atomic clock 80. The receiving DPLL 102n may now be stabilized by both the DPLLs 102a and 102b with respect to long and very long term stability, while still having the excellent low output jitter levels due to the local crystal oscillator based system clock SCLK.

Figure 5:
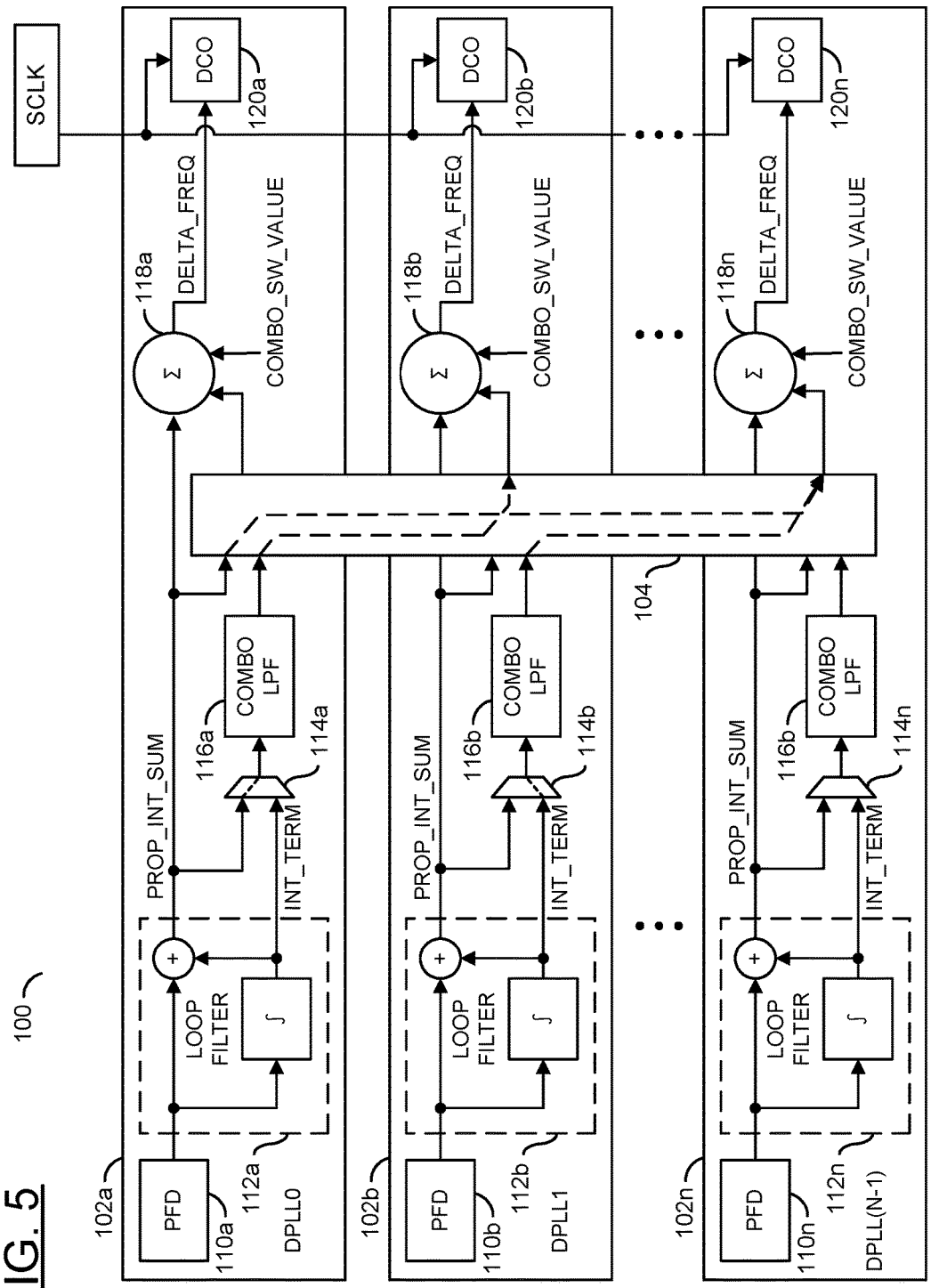
FIG. 5 is a diagram illustrating an example configuration of multiple DPLLs coupled together by a time slotted bus in accordance with an example embodiment of the invention.

Referring to FIG. 5, a diagram is shown illustrating a conceptual block diagram of the DPLLs 102a-102n of the synchronization circuit 100 where the combobus 104 is configured such that DPLL 102a is sourcing DPLLs 102b and 102n, and DPLL 102n is also sourced by DPLL 102b. In the example shown, the DPLLs 102a-102n may comprise a block (or circuit) 110, a block (or circuit) 112, a block (or circuit) 114, a block (or circuit) 116, a block (or circuit) 118, and/or a block (or circuit) 120. The circuit 110 may implement a phase frequency detector (PFD) circuit. The circuit 112 may implement a loop filter (LPF) circuit. In an example, the circuit 112 may comprise an integrator and an adder. The circuit 114 may implement a multiplexor. The circuit 116 may implement a filter circuit. The circuit 118 may implement a summing circuit. The circuit 120 may implement digitally controlled oscillator (DCO) circuit. Each of the DPLLs 102a-102n may each implement similar circuits 110a-110n, 112a-112n, 114a-114n, 116a-116n, 118a-118n and 120a-120n. The DPLLs 102a-102n may implement other components (not shown). The number, type and/or arrangement of the components of the DPLLs 102a-102n may be varied according to the design criteria of a particular implementation.

Each of the phase frequency detectors 110a-110n may be configured to perform phase and frequency measurements (e.g., comparisons) between a reference input signal (not shown) and a feedback signal (not shown). The phase frequency detectors 110a-110n may generate an indication of an amount of error (e.g., a difference between the reference signals and the feedback signals). In an example, the phase frequency detectors 110a-110n may generate a phase error signal in response to a comparison of the respective reference signals and feedback signals. The phase error signal may be presented to the loop filter circuits 112a-112n. In an example, the phase error signal may comprise a multibit signed phase word.

In an example, the loop filters 112a-112n may be configured as a low pass filter. For example, the loop filters 112a-112n may filter high frequencies from the error signals received from the phase frequency detectors 110a-110n. The loop filters 112a-112n may generate a first signal (e.g., PROP_INT_SUM) and second signal (e.g., INT_TERM). The signal PROP_INT_SUM may be presented to a first input of the multiplexer 114 and a first input of the summing circuit 118. The circuit 102a may be further configured to broadcast the signal PROP_INT_SUM in a first respective time slot on the combobus 104. The signal INT_TERM may be presented to a first input of the multiplexer 114. An output of the multiplexer 114 may be presented to an input of the filter circuit 116. In an example, the circuit 102a may be configured such that the signal PROP_INT_SUM at the first input of the multiplexer 114 is directed to the output of the multiplexer circuit. The circuit 102a may be further configured to broadcast a signal presented at an output of the filter circuit 116 in a second respective time slot on the combobus 104.

A second input of the summing circuit 118 may be configured to receive parameters from the combobus 104. A third input of the summing circuit 118 may be configured to receive a programmable value (e.g., COMBO_SW_VALUE). The programmable value COMBO_SW_VALUE may be stored in a register connected to the third input of the summing circuit 118. An output of the summing circuit 118 may present a signal (e.g., DELTA_FREQ_ to an first input of the DCO 120. The system clock SCLK may be presented to a second input of the DCO 120. The circuit 102b-102n may be configured similarly, except for which signals are broadcast on the combo bus 104 and which signals on the combobus 104 are retrieved and presented to the respective summing circuits 118b-118n. In an example, the circuit 102b may broadcast the output of the filter circuit 116b in a respective time slot of the combobus 104 and retrieve the output of the filter circuit 116a from the respective time slot in which the value was broadcast by the circuit 102a. In the same example, the circuit 102n may be configured to not broadcast any values, but retrieve both (i) the output of the loop filter circuit 112a from the respective time slot in which the value was broadcast by the circuit 102a and (ii) the output of the filter circuit 116b from the respective time slot in which the value was broadcast by the circuit 102b.

The digitally controlled oscillator circuits 120a-120n may be configured to generate output clock signals in response to the system clock SCLK and the signal DELTA_FREQ from the respective summing circuits 118a-118n. The DCO circuits 120a-120n may align the output clock signals to the input reference signals in response to offsets generated by one or more of the loop filters 112a-112n, the filters 116a-116n, and the respective programmable values COMBO_SW_VALUE. In various embodiments, the output clock signals generated by the DCO circuits 120a-120n may be provided, directly or indirectly, as the feedback signals to the phase frequency detectors 110a-110n.

Although only three DPLLs 102a-102n are shown in FIG. 5, the techniques in accordance with embodiments of the invention may be extended (scaled) to other (e.g., 9, etc.) numbers of DPLLs. The DPLLs 102a-102n are coupled to one another by the time slotted bus 104. In an example, dashed lines in the combo bus block 104 illustrate an example configuration of the DPLL 102n adding a first parameter (e.g., PROP_INT_SUM) from the DPLL 102a and a second parameter (e.g., POST-FILTERED INT_TERM) from the DPLL 102b to its own loop filter output. The DPLL 102b is illustrated adding the post-filtered parameter POST-FILTERED INT_TERM from the DPLL 102a to its own loop filter output. The DPLL 102a is illustrated as not using any combo bus data. However, the DPLL 102a may also be configured in a similar way as the DPLLs 102b and 102n. In general, all DPLLs implemented in the circuit 100 may be configured to use any data supplied by combo bus 104.

The DPLLs 102a-102n may transfer combo values to each other. In various embodiments, the combo values may be large (e.g., 48-bits). Instead of having N 48-bit busses, the combo values may be time division multiplexed on one, shared 48-bit combo bus connected to each DPLL 102a-102n. However, other numbers of bits may be implemented to meet the design criteria of a particular implementation. In various embodiments, each DPLL 102a-102n may have two fixed timeslots allocated on the bus 104 in which the DPLLs 102a-102n may broadcast respective parameters. However, other numbers of timeslots may be allocated accordingly to meet the design criteria of a particular implementation. In an example, each DPLL 102a-102n may use the two allocated time slots to broadcast (i) the same value (e.g., PROP_INT_SUM) that is used by the output digital controlled oscillator (DCO), which may be referred to as "unfiltered," and/or a post low pass filtered value providing a lower bandwidth than what is used in the regular loop filter 112 without affecting the output clock of the DPLL. The combo filter 116 can take either an integrator value (e.g., INT_TERM) or a total loop filter output value (e.g., PROP_INT_SUM) as an input. The output of the combo LPF 116 may be referred to as "post-filtered", as the combo LPF 116 is in addition to the regular DPLL loop filter 112.

In some embodiments, any of the DPLLs 102a-102n may collect (retrieve) data from up to two programmable timeslots and add the retrieved data to its own loop filter output (e.g., PROP_INT_SUM). However, two timeslots is not a design limitation, more programmable timeslots may easily be added to meet the design criteria of a particular implementation. The timeslots at which data is fetched may be defined by respective user programmable register values (e.g., PRI_COMBOBUS_ID, SEC_COMBOBUS_ID, etc.) in each DPLL 102a-102n. In addition to the combo bus data, the respective programmable 48-bit software register value (e.g., COMBO_SW_VALUE) may be added. The software register value COMBO_SW_VALUE register is generally added (e.g., not optional) and may be zero by default.

Figure 6:
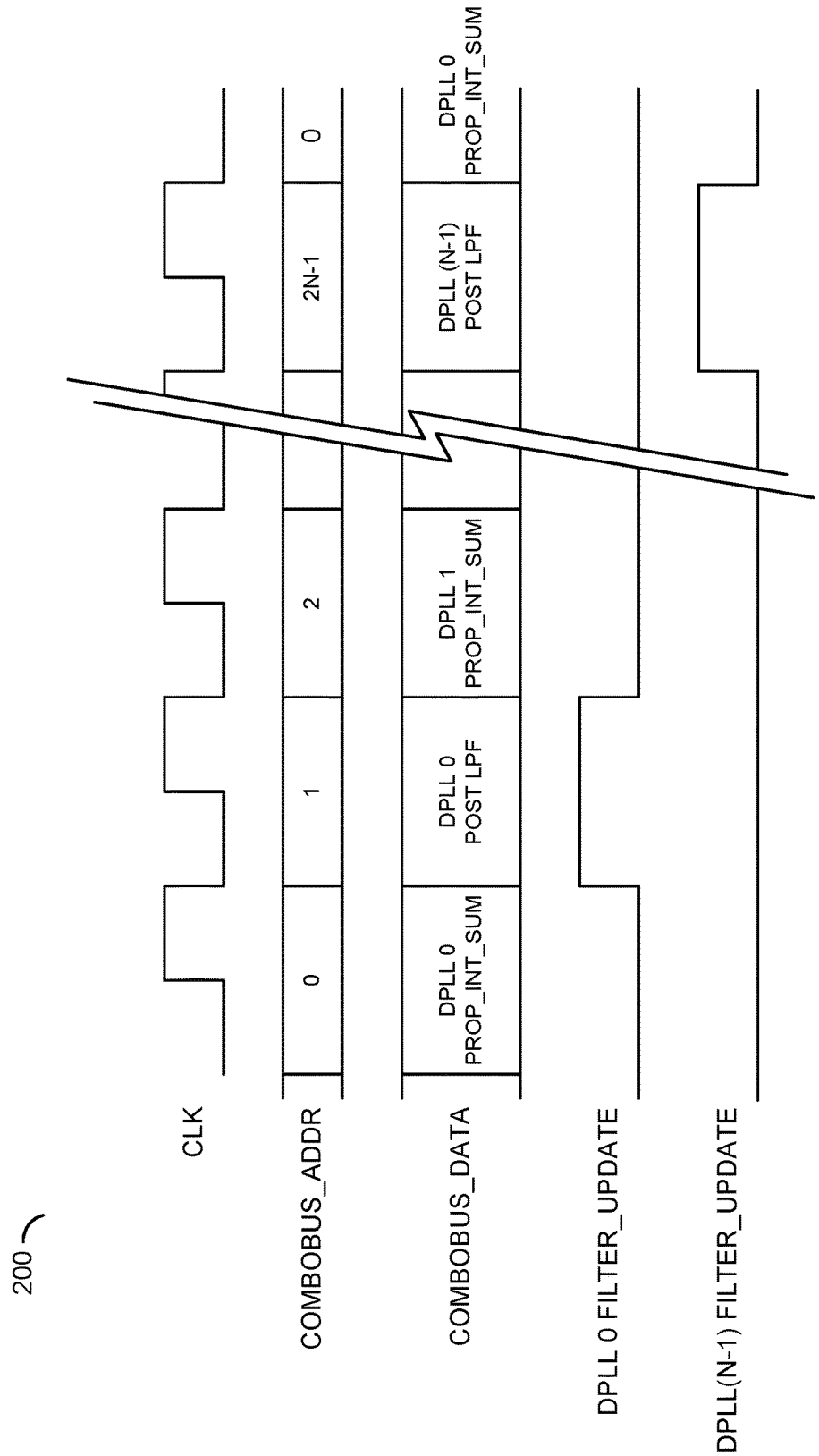
FIG. 6 is a timing diagram illustrating an example operation of a time slotted bus in accordance with an example embodiment of the invention.

Referring to FIG. 6, a timing diagram 200 is shown illustrating an example operation of the combo bus 104 of FIG. 5. In an example embodiment, each DPLL 102a-102n has two transmit timeslots on the time slotted data bus (e.g., COMBOBUS_DATA), the first time slot may be used to transmit the PROP_INT_SUM from the respective loop filter 112 while the second time slot may be used to transmit the output from the respective combo low pass filter 116. In various embodiments, a 5-bit address bus (e.g., COMBOBUS_ADDR) may also be implemented to identify the source of the data currently on the data bus COMBOBUS_DATA. However, other widths of addresses and/or address bus may be implemented accordingly to meet the design criteria of a particular implementation.

Figure 7:
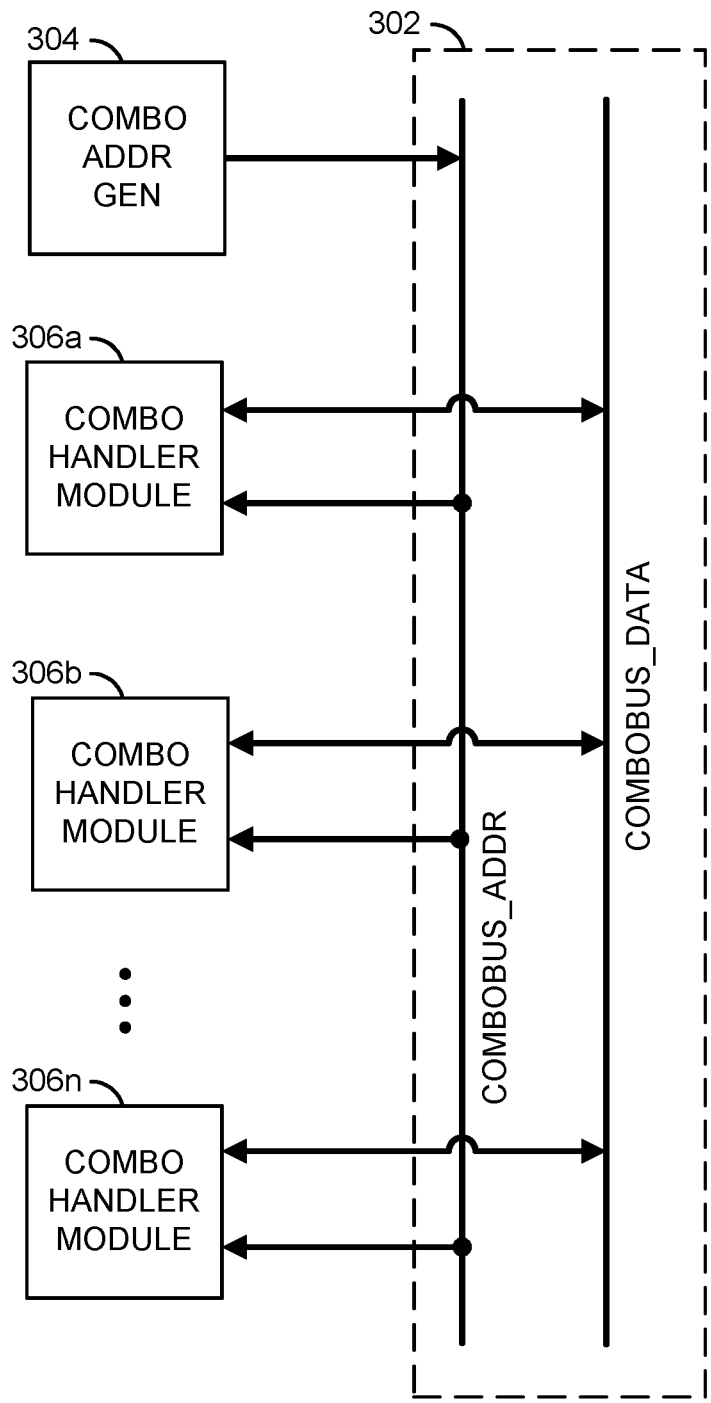
FIG. 7 is a diagram illustrating an example implementation of a time slotted bus in accordance with an example embodiment of the invention.

Referring to FIG. 7, a diagram of a combo bus architecture 300 is shown illustrating an example implementation of the time slotted combo bus 104. In an example, the combo bus architecture 300 may comprise a pair (e.g., address and data) of busses 302, an address generator 304, and a number of combo handler (bus interface) modules 306a-306n. In various embodiment, each DPLL 102a-102n may be integrated with a respective one of the combo handler (bus interface) modules 306a-306n. The combo handler modules 306a-306n may be configured to receive and/or broadcast values (parameters) from and to a bus 302 coupling the DPLLs 102a-102n. The bus 302 may comprise data (e.g., COMBOBUS_DATA) and/or address (e.g., COMBOBUS_ADDR) busses.

Figure 8:
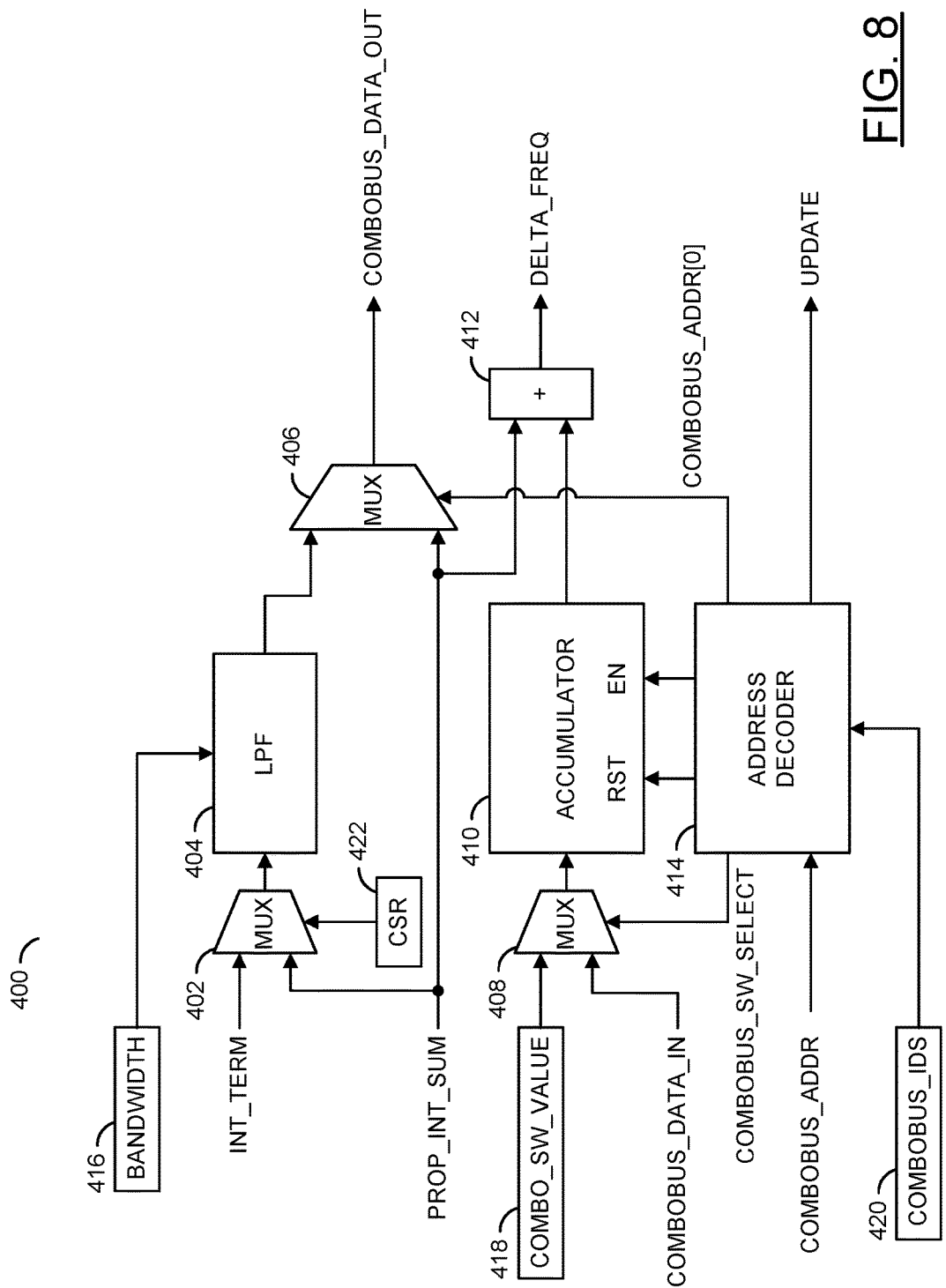
FIG. 8 is a diagram illustrating an example implementation of a combobus interface module in accordance with an example embodiment of the invention.

Referring to FIG. 8, a diagram of a circuit 400 is shown illustrating an example implementation of a combo handler module in accordance with an example embodiment of the invention. The circuit (or module) 400 may be used to implemented each of the bus handler modules 306a-306n in FIG. 7. Each DPLL 102a-102n may have a built in combo handler module implemented similarly to the module 400. The combo handler module 400 may be configured to broadcast data onto the combo bus 104 and also fetch data from the combo bus 104. A set of programmable registers 420 may contain the addresses (e.g., COMBOBUS_IDS) of the timeslots at which the combo handler 400 should fetch data from the combo bus 104. The fetched data is accumulated by the combo handler 400 in an accumulator 410. At the receiving DPLL's own two timeslots, the local loop filter output and an additional value COMBO_SW_VALUE are added by the accumulator 410. The additional value COMBO_SW_VALUE may be programmable by the external (to the DPLL) processor 108 using a register 418. The additional value COMBO_SW_VALUE allows the system to add a software and/or firmware controlled combo source to the DPLL.

An upper part of the handler 400 is the outgoing path. In various embodiments, the upper part comprises a multiplexer 402, a low pass filter 404 and a multiplexer 406. The upper part does the source selection for the low pass filter and the low pass filter itself. In an example, a register 422 may be programmed to select the source for the low pass filter 404. The register 422 may be implemented as a configuration bit or as a part of a set of configuration registers. The register 422 is typically programmed at power up by a user, and generally remains static during normal operation.

The data going to the combo bus 104 is switched between an output of the low pass filter 404 and the unfiltered signal PROP_INT_SUM. The bandwidth of the low pass filter 404 may be programmable (e.g., via a value BANDWIDTH). The value BANDWIDTH may be stored in a register 416, which may be programmed by the processor 108. In various embodiments, the low pass filter 404 may be switchable between a first order filter and a second order filter.

A lower part of the handler 400 is the incoming part from the combo bus. In various embodiments, the lower part may comprise a multiplexer 408, an accumulator 410, a summing block 412 and an address decoder 414. The accumulator 410 accumulates the data from the timeslots indicated by the values (e.g., COMBOBUS_IDS) stored in combobus ID registers 420. In an example implementation, there are two combobus_ID registers per DPLL. However, more registers may be implemented to meet the design criteria of a particular implementation.

Each DPLL may accumulate data over a cycle of 2N timeslots and then outputs the accumulated data to the DCO. The accumulation cycle starts at a different address for each DPLL. That way the updates to the DCOs are spread out evenly over time, which reduces power spikes and thereby the phase noise spurs in the output clocks due to cross talk. For a particular DPLL 102i, the whole sequence starts at timeslot (2*i)+2 and ends at timeslot (2*i)+1. At the start of the accumulation cycle, the accumulator 410 may be reset (e.g., by a signal RST) before any data is accumulated. At the end of the accumulation cycle, an output of the summing block 412 (e.g., DELTA_FREQ) is updated with the new accumulated value together with an update enable pulse (e.g., UPDATE) for the DCO.

The accumulator 410 adds the output value from the multiplexer 408 to its current value when the signal EN is asserted (e.g., HIGH). When the signal RST is asserted (e.g., HIGH), the accumulator 410 is reset to zero. If both of the signals RST and EN are asserted (e.g., HIGH), then the output value of the multiplexer 408 is loaded into the accumulator 410 instead of added to the current value (e.g., acc=mux_output instead of acc=acc+mux_output).

The address decoder 414 generally receives the address information from the combo bus 104 and generates the signals EN, RST, UPDATE, and COMBOBUS_SW_SELECT based on the address information received and the values COMBOBUS_IDS stored in the registers 420. The signal COMBOBUS_SW_SELECT is generally used to control the multiplexer 408. In an example, when the signal COMBOBUS_SW_SELECT is asserted (e.g., HIGH), the value COMBO_SW_VALUE is selected. When the signal COMBOBUS_SW_SELECT is not asserted (e.g., LOW), the signal COMBIBUS_DATA_IN is selected. In the example where each DPLL has two dedicated timeslots, the address decoder generally uses the least significant bit (LSB) of the signal COMBOBUS_ADDR (e.g., COMBUS_ADDR[0]) to control the multiplexer 406. In an example, the signal PROP_INT_SUM may be selected when the LSB is 0 and the output of the LPF 404 may be selected when the LSB is 1.

Figure 9:
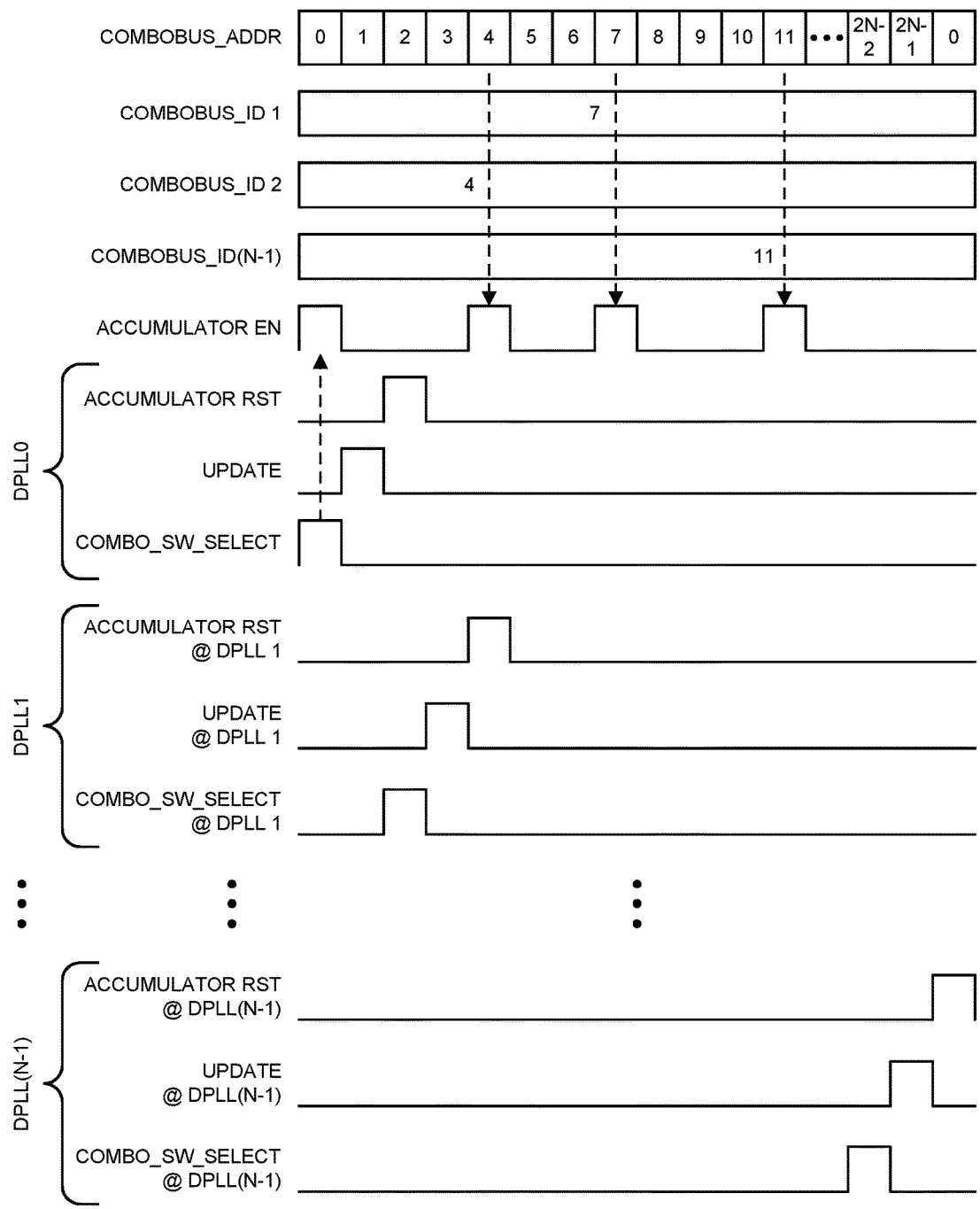
FIG. 9 is a timing diagram illustrating an example operation of a combobus interface module in accordance with an example embodiment of the invention.

Referring to FIG. 9, a timing diagram is shown illustrating an example operation of a combobus handler module 400 in accordance with an example embodiment of the invention. The upper part of the diagram applies to DPLL 102a. For completeness, the signals for DPLL 102b and DPLL 102n are also shown. The timeslot in which the various signals are asserted (e.g., HIGH) is dependent on the DPLL ID number:
COMBO_SW_SELECT: timeslot=2*DPLL_ID
UPDATE: timeslot=2*DPLL_ID+1
Accumulator RST: timeslot=2*DPLL_ID+2
Accumulator EN: whenever the timeslot number matches the value in one of the COMBOBUS_ID registers 420 AND timeslot 2*DPLL_ID to load the respective COMBO_SW_VALUE.

For a particular DPLL (e.g., DPLL 102*i*), the whole sequence starts at timeslot (2*i)+2 and ends at timeslot (2*i)+1.

A time slotted bus system was developed that deals with the inter-DPLL coupling for a multitude of DPLLs. A common time slotted bus connects to all DPLLs. Each DPLL gets two timeslots on the bus in which it can broadcast data. The first timeslot may be used to broadcast the regular loop filter output data. The second timeslot may be used to broadcast post filtered data. The post-filter may be implemented as a programmable low pass filter that can take either the regular loop filter output data or just the integrator data of the loop filter. Both the order and the bandwidth of the post-filter are programmable by the user.

On the receiving side, each DPLL may be implemented with a set of user programmable registers that contain the timeslots in which the DPLL fetches data from the bus. The fetched bus data is accumulated and added to loop filter output data of the (receiving) DPLL. The combined data is used to control the DPLLs Digital Controlled Oscillators that generate the output and feedback clocks.

Although embodiments of the invention have been described in the contexts of Ethernet and mobile communications (e.g., 5G) applications, the present invention is not limited to either Ethernet or 5G applications, but may also be applied in other high data rate wireless and wired communications applications where different rapid switching, multiple channel, and multiple user issues may exist. The present invention addresses concerns related to high speed wireless communications, mobile and stationary transceivers and point-to-point links. Future generations of wireless communications applications using radio frequency (RF), microwave, and millimeter-wave links can be expected to provide increasing speed, increasing flexibility, and increasing numbers of interconnections and layers. The present invention may also be applicable to wireless communications systems implemented in compliance with either existing (legacy, 2G, 3G, 4G) specifications or future specifications.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
a plurality of digital phase-locked loops; and
a time slotted bus coupling the plurality of digital phase-locked loops, wherein (i) each of said digital phase-locked loops comprises a bus interface module coupling said digital phase-locked loop to said time slotted bus, (ii) said plurality of digital phase-locked loops are configured to exchange parameters between two or more of said plurality of digital phase-locked loops using one or more respective time slots of a plurality of time slots of said time slotted bus, and (iii) at least two of said bus interface modules are configured to transmit parameter data to said time slotted bus during said one or more respective time slots of said plurality of time slots of said time slotted bus.

2. The apparatus according to claim 1, wherein each of said bus interface modules is configured to fetch data from or present data to said time slotted bus during said one or more respective time slots of said plurality of time slots of said time slotted bus.

3. The apparatus according to claim 1, wherein said time slotted bus comprises a first bus communicating parameter data and a second bus communicating address information identifying said time slots.

4. The apparatus according to claim 3, wherein said time slotted bus further comprises an address generator driving said second bus.

5. The apparatus according to claim 4, wherein said address generator is configured to cycle through a number of addresses corresponding to the time slots associated with said plurality of digital phase-locked loops.

6. The apparatus according to claim 5, wherein said number of addresses is an integer multiple of the number of said digital phase-locked loops.

7. The apparatus according to claim 1, wherein said parameters comprise one or more of an unfiltered offset value or a filtered offset value.

8. The apparatus according to claim 1, wherein:
one or more of said plurality of digital phased-locked loops are configured as sourcing digital phased-locked loops; and
at least one other of said plurality of digital phased-locked loops is configured as a receiving digital phased-locked loop.

9. A method of coupling a plurality of digital phase-locked loops comprising:
connecting each of said plurality of digital phase-locked loops to a time slotted bus;
broadcasting addresses corresponding to predefined time slots of said time slotted bus; and
exchanging parameters between two or more of said digital phase-locked loops using one or more of said predefined time slots of said time slotted bus associated with said two or more digital phase-locked loops.

10. The method according to claim 9, wherein said time slotted bus comprises a first bus communicating parameter data and a second bus communicating said addresses.

11. The method according to claim 9, wherein said parameters comprise one or more of an unfiltered offset value or a filtered offset value.

12. The method according to claim 9, wherein:
one or more of said plurality of digital phased-locked loops are configured as sourcing digital phased-locked loops; and
at least one other of said plurality of digital phased-locked loops is configured as a receiving digital phased-locked loop.

13. The method according to claim 9, wherein said plurality of digital phased-locked loops are configured to synchronize at least two telecommunications networks.

14. The method according to claim 9, wherein said plurality of digital phased-locked loops are configured to synchronize a mobile network base station to a telecommunications network.

15. An apparatus comprising:
a plurality of digital phase-locked loops; and
a time slotted bus coupling the plurality of digital phase-locked loops, wherein said plurality of digital phase-locked loops are configured to exchange parameters between two or more of said plurality of digital phase-locked loops using one or more respective time slots of a plurality of time slots of said time slotted bus, wherein said time slotted bus comprises a first bus communicating parameter data and a second bus communicating address information identifying said time slots.

16. The apparatus according to claim 15, wherein said time slotted bus further comprises an address generator driving said second bus.

17. The apparatus according to claim 16, wherein said address generator is configured to cycle through a number of addresses corresponding to the time slots associated with said plurality of digital phase-locked loops.

18. The apparatus according to claim 17, wherein said number of addresses is an integer multiple of the number of said digital phase-locked loops.

19. The apparatus according to claim 15, wherein said parameters comprise one or more of an unfiltered offset value or a filtered offset value.

20. The apparatus according to claim 15, wherein:
one or more of said plurality of digital phased-locked loops are configured as sourcing digital phased-locked loops; and
at least one other of said plurality of digital phased-locked loops is configured as a receiving digital phased-locked loop.

* * * * *